United States Patent
Shin

(10) Patent No.: US 11,817,846 B2
(45) Date of Patent: Nov. 14, 2023

(54) ELECTRONIC COMPONENT

(71) Applicant: Murata Manufacturing Co., Ltd., Nagaokakyo (JP)

(72) Inventor: Yasuaki Shin, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1279 days.

(21) Appl. No.: 16/354,233

(22) Filed: Mar. 15, 2019

(65) Prior Publication Data
US 2019/0214963 A1  Jul. 11, 2019

Related U.S. Application Data

(63) Continuation of application No. PCT/JP2017/024940, filed on Jul. 7, 2017.

(30) Foreign Application Priority Data

Sep. 27, 2016  (JP) .................................. 2016-188871

(51) Int. Cl.
*H03H 9/02* (2006.01)
*H03H 9/10* (2006.01)
(Continued)

(52) U.S. Cl.
CPC ......... *H03H 9/02897* (2013.01); *H01L 24/13* (2013.01); *H01L 25/18* (2013.01);
(Continued)

(58) Field of Classification Search
CPC ............. H03H 9/02897; H03H 9/1085; H03H 9/0542; H03H 9/059; H01L 24/13;
(Continued)

(56) References Cited

U.S. PATENT DOCUMENTS 8,202,741 B2 * 6/2012 Neff .................. H01L 33/62
438/22
8,963,652 B2 * 2/2015 Kitajima .............. H03H 9/0542
333/132

(Continued)

FOREIGN PATENT DOCUMENTS

JP    2003-218150 A    7/2003
JP    2005-151287 A    6/2005
(Continued)

OTHER PUBLICATIONS

Official Communication issued in International Patent Application No. PCT/JP2017/024940, dated Sep. 12, 2017.

*Primary Examiner* — Rakesh B Patel
*Assistant Examiner* — Jorge L Salazar, Jr.
(74) *Attorney, Agent, or Firm* — KEATING & BENNETT, LLP

(57) ABSTRACT

An electronic component includes a package substrate extending in a longitudinal direction, and chip components disposed along the longitudinal direction of the package substrate and each connected to the package substrate by a bump. A height of a bump connecting at least one chip component disposed at an end portion in the longitudinal direction among the chip components and the package substrate is greater than a height of a bump connecting at least one chip component disposed inward relative to the end portion in the longitudinal direction among the chip components and the package substrate.

20 Claims, 3 Drawing Sheets

(51) Int. Cl.
  *H01L 25/18*      (2023.01)
  *H03H 9/05*       (2006.01)
  *H01L 23/00*      (2006.01)
  H01L 25/065       (2023.01)
  H01L 25/00        (2006.01)

(52) U.S. Cl.
  CPC ....... *H03H 9/1085* (2013.01); *H01L 25/0655* (2013.01); *H01L 25/50* (2013.01); *H01L 2224/131* (2013.01); *H01L 2224/13139* (2013.01); *H01L 2224/13144* (2013.01); *H01L 2224/13155* (2013.01); *H01L 2224/16227* (2013.01); *H01L 2224/81205* (2013.01); *H01L 2224/81815* (2013.01); *H01L 2924/15313* (2013.01); *H01L 2924/35121* (2013.01); *H03H 9/059* (2013.01); *H03H 9/0542* (2013.01)

(58) Field of Classification Search
  CPC ..... H01L 25/18; H01L 25/0655; H01L 25/50; H01L 2224/131; H01L 2224/13139; H01L 2224/13144; H01L 2224/13155; H01L 2224/16227; H01L 2224/81205; H01L 2224/81815; H01L 2924/15313; H01L 2924/35121; H01L 24/16; H01L 2224/14135; H01L 2224/13147; H01L 2924/351

See application file for complete search history.

(56) References Cited

U.S. PATENT DOCUMENTS

| | | | |
|---|---|---|---|
| 9,184,495 B2 * | 11/2015 | Kataoka | H01Q 1/40 |
| 2004/0227236 A1 * | 11/2004 | Sawamoto | H01L 23/49822 |
| | | | 257/734 |
| 2004/0238954 A1 | 12/2004 | Miyaji et al. | |
| 2005/0200429 A1 | 9/2005 | Adachi et al. | |
| 2008/0197488 A1 | 8/2008 | Trezza | |
| 2009/0114441 A1 * | 5/2009 | Hashimoto | H03H 9/1021 |
| | | | 174/521 |
| 2013/0223017 A1 | 8/2013 | Kitaura et al. | |
| 2015/0255702 A1 * | 9/2015 | Takebayashi | H01L 23/5383 |
| | | | 174/250 |

FOREIGN PATENT DOCUMENTS

| | | |
|---|---|---|
| JP | 2010-519739 A | 6/2010 |
| WO | 2012/060034 A1 | 5/2012 |

* cited by examiner

ELECTRONIC COMPONENT

CROSS REFERENCE TO RELATED APPLICATIONS

This application claims the benefit of priority to Japanese Patent Application No. 2016-188871 filed on Sep. 27, 2016 and is a Continuation Application of PCT Application No. PCT/JP2017/024940 filed on Jul. 7, 2017. The entire contents of each of these applications are hereby incorporated herein by reference.

BACKGROUND OF THE INVENTION

1. Field of the Invention

The present invention relates to an electronic component in which chip components, such as a plurality of SAW chips, are connected to a package substrate by bumps.

2. Description of the Related Art

Flip-chip mounting has been used in which chip components are connected to a package substrate by bumps. However, it is becoming necessary to mount a plurality of chip components on a single package substrate in response to electronic devices achieving multifunctionality. For example, Japanese Unexamined Patent Application Publication No. 2005-151287 describes such an electronic component having a configuration in which two filters are mounted on a single package substrate by a plurality of bumps.

However, when an electronic component in which a plurality of chip components are connected to a package substrate by bumps is exposed to a change in ambient temperature, the thermal expansion coefficient of the chip component differs from that of the package substrate, so that the amount of displacement caused by thermal expansion of the chip component and the amount of displacement caused by thermal expansion of the package substrate differ from each other. Due to this difference in the amount of displacement, a stress is generated in the bump that connects the chip component and the package substrate. In an electronic component in which a plurality of chip components are bump-bonded to a package substrate extending in a longitudinal direction, a displacement of an end portion in the longitudinal direction of the package substrate is larger than a displacement in an inner region relative to the end portion in the longitudinal direction of the package substrate. Therefore, the stress generated in the bump connecting the chip component disposed at the end portion in the longitudinal direction of the package substrate and the package substrate becomes larger than the stress generated in the bump connecting the chip component disposed in the inner region relative to the end portion in the longitudinal direction of the package substrate and the package substrate. As such, damage such as breakage, peeling, or the like may occur on at least one of the bumps connecting the chip component to the package substrate disposed at the end portion in the longitudinal direction of the package substrate and a bonding portion of the bump, or failure may occur in the connection state, and thus, reliability may be reduced.

SUMMARY OF THE INVENTION

Preferred embodiments of the present invention provide electronic components that are each capable of improving reliability.

An electronic component according to a preferred embodiment of the present invention includes a package substrate extending in a longitudinal direction and a plurality of chip components disposed along the longitudinal direction of the package substrate and each connected to the package substrate by a bump. A height of a bump connecting at least one chip component disposed at an end portion in the longitudinal direction of the package substrate among the plurality of chip components and the package substrate is greater than a height of a bump connecting at least one chip component disposed inward relative to the end portion in the longitudinal direction of the package substrate among the plurality of chip components and the package substrate.

In an electronic component according to a preferred embodiment of the present invention, the bump connecting the at least one chip component disposed at the end portion in the longitudinal direction of the package substrate and the package substrate is a solder bump.

In an electronic component according to a preferred embodiment of the present invention, the bump connecting the at least one chip component disposed inward relative to the end portion in the longitudinal direction of the package substrate and the package substrate is a gold bump.

In an electronic component according to a preferred embodiment of the present invention, the chip component is a SAW chip.

In an electronic component according to a preferred embodiment of the present invention, the package substrate is an alumina substrate.

In an electronic component according to a preferred embodiment of the present invention, the bump connecting the at least one chip component disposed at the end portion in the longitudinal direction of the package substrate and the package substrate is a lead-free solder bump.

According to preferred embodiments of the present invention, it is possible to reduce the stress generated in the bump connecting the chip component disposed at the end portion in the longitudinal direction of the package substrate and the package substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
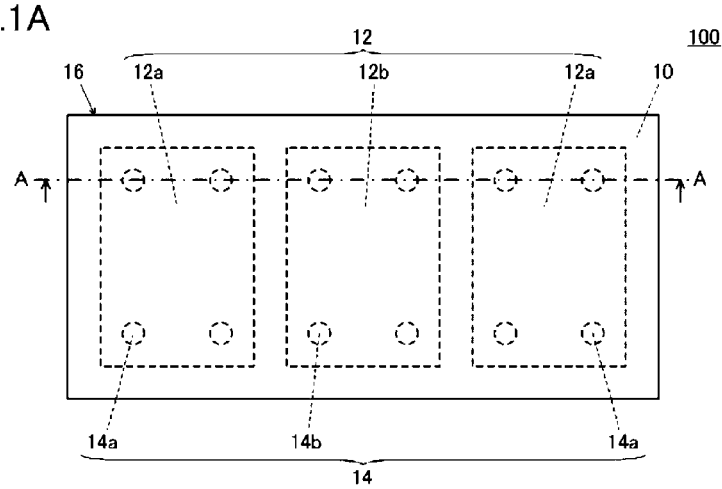
FIG. 1A is a top view illustrating a configuration of an electronic component according to a first preferred embodiment of the present invention.

Hereinafter, electronic components according to preferred embodiments of the present invention will be described with reference to the accompanying drawings. In the following description of the preferred embodiments, the same or corresponding portions in the drawing are denoted by the same reference numerals, and the description thereof will not be repeated.

First Preferred Embodiment

Figure 1B:
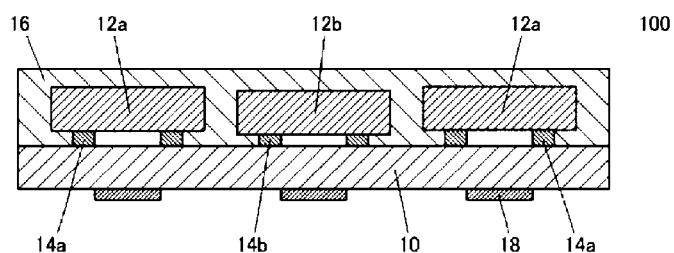
FIG. 1B is a cross-sectional view of the electronic component of FIG. 1A as viewed from an arrow direction of an A-A line.

FIG. 1A is a top view illustrating a configuration of an electronic component according to a first preferred embodiment of the present invention. FIG. 1B is a cross-sectional view of the electronic component of FIG. 1A as viewed from an arrow direction of an A-A line. Note that in FIG. 1A, a bump 14 is illustrated seeing through a sealing portion 16 and a chip component 12.

As illustrated in FIGS. 1A and 1B, in the present preferred embodiment, three chip components 12 disposed along a longitudinal direction of a rectangular or substantially rectangular package substrate 10 are connected to one main surface of the package substrate 10 by bumps 14.

The chip component 12 is preferably a surface acoustic wave (SAW) chip, for example. The package substrate 10 is preferably an alumina substrate, for example. A chip component 12a disposed at an end portion in the longitudinal direction of the package substrate 10 is connected to the package substrate 10 by a bump 14a, for example, at four corners of the chip component 12a. The bump 14a is preferably a lead-free solder bump, for example.

A chip component 12b disposed inward relative to the end portion in the longitudinal direction of the package substrate 10, in other words, in a central portion in the longitudinal direction of the package substrate 10, is connected to the package substrate 10 by a bump 14b, for example, at four corners of the chip component 12b. The bump 14b is preferably made of a gold bump, for example. Note that in this specification, a "rectangular shape" includes a substantially rectangular shape in addition to a rectangle, and also includes, for example, a shape in which a corner portion is rounded into an arc shape, a shape in which a corner portion is chamfered, and a shape being partially cut out.

The sealing portion 16 to seal the connected chip component 12 is provided on an upper surface of the package substrate 10. The sealing portion 16 is preferably made of, for example, resin. Note that the sealing portion 16 is not limited to a sealing portion made of resin. For example, a metal or other suitable material may be used as the sealing portion 16.

Wiring (not illustrated) is provided in and/or on the package substrate 10. The chip component 12 is connected to an external terminal 18 provided on the other main surface of the package substrate 10 via the wiring.

In an electronic component 100, the bump 14a connected with the chip component 12a disposed at the end portion in the longitudinal direction of the package substrate 10 is preferably a lead-free solder bump, for example, and the package substrate 10 and the chip component 12a are reflow-bonded to each other. The height of the bump 14a is preferably greater than or equal to about 80 µm and less than or equal to about 100 µm, for example.

The bump 14b connected with the chip component 12b disposed inward relative to the end portion in the longitudinal direction of the package substrate 10 is preferably a gold bump, for example, and the package substrate 10 and the chip component 12b are ultrasonically bonded to each other. The height of the bump 14b is preferably greater than or equal to about 15 µm and less than or equal to about 20 µm, for example.

Therefore, the height of the bump 14a connecting the chip component 12a disposed at the end portion in the longitudinal direction of the package substrate 10 and the package substrate 10 is greater than the height of the bump 14b connecting the chip component 12b disposed inward relative to the end portion in the longitudinal direction of the package substrate 10 and the package substrate 10.

The stress generated in the bump decreases as the height of the bump increases. For example, a height of a lead-free solder bump is more easily increased than a height of a gold bump. Therefore, the height of the bump 14a, which is a lead-free solder bump, is able to be easily increased, and the stress is able to be reduced as compared with the bump 14b. Accordingly, the connection failure caused by damage, such as breakage, peeling, or other damage, occurring on at least one of the bump 14a and a bonding portion of the bump 14a is reduced or prevented, and thus, it is possible to improve the reliability of the electronic component 100. Note that the bonding portion of the bump 14a refers to a bonding interface and the vicinity thereof between the bump 14a and the package substrate 10, and a bonding interface and the vicinity thereof between the bump 14a and the chip component 12a.

In the electronic component 100 according to the present preferred embodiment, by setting the height of the bump 14a connecting the chip component 12a disposed at the end portion in the longitudinal direction of the package substrate 10 and the package substrate 10 to be greater than the height of the bump 14b connecting the chip component 12b disposed inward relative to the end portion in the longitudinal direction of the package substrate and the package substrate 10, it is possible to reduce the stress applied to the bump 14a connecting the chip component 12a disposed at the end portion in the longitudinal direction of the package substrate 10 and the package substrate 10. Therefore, it is possible to reduce or prevent the connection failure caused by damage, such as breakage, peeling, or other damage occurring on at least one of the bump 14a connecting the chip component 12a disposed at the end portion in the longitudinal direction of the package substrate 10 and the package substrate 10 and the bonding portion of the bump 14a, and thus, it is possible to improve the reliability of the electronic component 100.

Note that all of the bumps connected with the chip component 12a disposed at the end portion in the longitudinal direction of the package substrate 10 are bumps 14a, and all of the bumps connected with the chip component 12b disposed in an inner region relative to the end portion in the longitudinal direction of the package substrate 10 are bumps 14b. As described above, it is possible to facilitate the manufacture of the electronic component 100 by classifying the plurality of chip components 12 into two types of chip components of the chip component 12a and the chip component 12b and setting the type of the bump according to each classification, rather than by setting the type of the bump for each of the chip components 12.

In addition, in the electronic component 100, the bump 14a connected to the chip component 12a disposed at the end portion in the longitudinal direction of the package substrate 10 is preferably made of, for example, lead-free solder having a Young's modulus of greater than or equal to about 20 GPa and less than or equal to about 50 GPa, and has softness and an excellent stress reduction property as compared with the bump 14b preferably made of, for example, gold having a Young's modulus of about 79 GPa. Note that the Young's modulus of the solder is preferably, for example, greater than or equal to about 15 GPa and less than or equal to about 30 GPa. Also, according to this characteristic, the connection failure caused by damage, such as breakage, peeling, or other damage occurring on at least one of the bump 14a and the bonding portion of the bump 14a is reduced or prevented, and it is possible to improve the reliability of the electronic component 100. The mechanism for stress reduction is also thought to be a mechanism different from the mechanism described above, and is not necessarily limited to the mechanism described in the present preferred embodiment.

The chip component 12 is not limited to a SAW chip. As the chip component 12, for example, a bulk acoustic wave (BAW) chip, a film bulk acoustic resonator (FBAR) chip, a semiconductor device chip, or other suitable chip component may be used. Further, it is not necessary for all of the plurality of chip components 12 to be the same type of chip component. In other words, the respective plurality of chip components 12 may be chip components of different types.

The package substrate 10 is not limited to an alumina substrate. As the package substrate 10, for example, a glass epoxy substrate, a low temperature co-fired ceramics (LTCC) substrate, or other suitable material may be used.

The bump 14a is not limited to a lead-free solder bump. As the bump 14a, for example, a general solder bump or other suitable bump may be used. The bump 14b is not limited to a gold bump. As the bump 14b, for example, a copper bump, a silver bump, a nickel bump, or other suitable bump may be used.

In FIG. 1A, three chip components 12 are disposed in alignment at equal intervals in the longitudinal direction of the package substrate 10, but the present invention is not limited to this configuration. For example, the chip components 12 may be arranged in a plurality of rows in the longitudinal direction of the package substrate 10, and four or more chip components 12 may be disposed in each of the plurality of rows.

In addition, in FIG. 1A, four bumps 14 are provided for one chip component 12, and are disposed at four corners of the chip component 12, but the present invention is not limited to this configuration. For example, six or more bumps 14 may be provided for one chip component 12, and may each be disposed at an arbitrary position on a bonding surface of the chip component 12.

In addition, in FIG. 1B, all of the chip components 12 have the same thickness, but the present invention is not limited thereto. For example, the thickness of the chip component 12a may be reduced, and the thickness of the chip component 12b may be increased.

Second Preferred Embodiment

Figure 2:
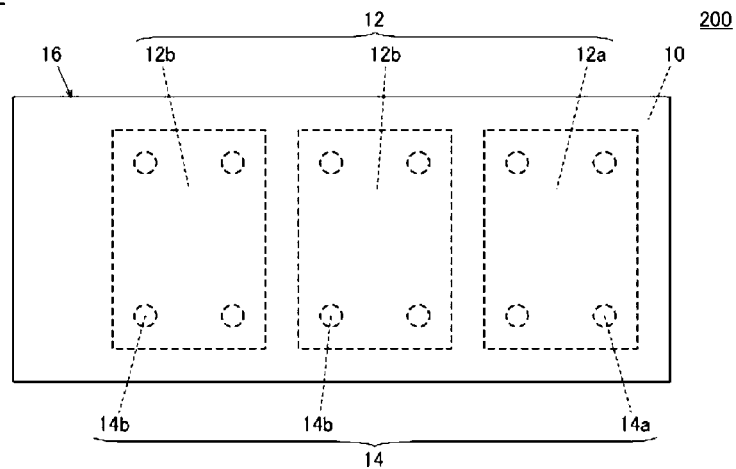
FIG. 2 is a top view illustrating a configuration of an electronic component according to a second preferred embodiment of the present invention.

FIG. 2 is a top view illustrating a configuration of an electronic component according to a second preferred embodiment of the present invention. In FIG. 2, the bump 14 is illustrated seeing through the sealing portion 16 and the chip component 12. As illustrated in FIG. 2, in an electronic component 200 according to the second preferred embodiment of the present invention, one chip component 12a is disposed at an end portion in a longitudinal direction of the package substrate 10, and two chip components 12b are disposed inward relative to the end portion in the longitudinal direction of the package substrate 10. In the present preferred embodiment, the arrangement of the chip components 12 is changed from that in the first preferred embodiment, and the remaining configuration is the same or substantially the same as that of the first preferred embodiment.

Third Preferred Embodiment

Figure 3:
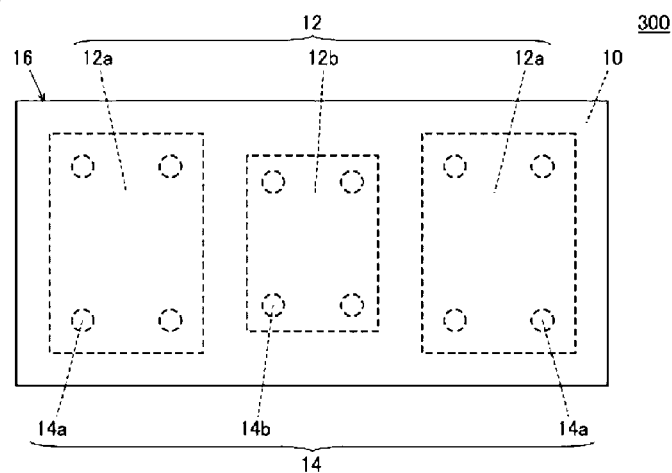
FIG. 3 is a top view illustrating a configuration of an electronic component according to a third preferred embodiment of the present invention.

FIG. 3 is a top view illustrating a configuration of an electronic component according to a third preferred embodiment of the present invention. In FIG. 3, the bump 14 is illustrated seeing through the sealing portion 16 and the chip component 12. As illustrated in FIG. 3, in an electronic component 300 according to the third preferred embodiment of the present invention, the chip component 12a that is larger than the chip component 12b is disposed at an end portion in a longitudinal direction of the package substrate 10, and the chip component 12b that is smaller than the chip component 12a is disposed inward relative to the end portion in the longitudinal direction of the package substrate 10. In other words, a plurality of chip components 12 having different sizes from each other are disposed on the package substrate 10.

Note that the size of the chip component 12 is not limited to a size in which the chip component 12a disposed at the end portion in the longitudinal direction of the package substrate 10 is larger than the chip component 12b disposed inward relative to the end portion in the longitudinal direction of the package substrate 10. For example, the size of the chip component 12b disposed inward relative to the end portion in the longitudinal direction of the package substrate 10 may be larger than the chip component 12a disposed at the end portion in the longitudinal direction of the package substrate 10, or the size of each of the plurality of chip components 12 may be individually changed. In the present preferred embodiment, the size of the chip component 12 is changed from that in the first preferred embodiment, and the remaining configuration is the same as that of the first preferred embodiment.

Fourth Preferred Embodiment

Figure 4:
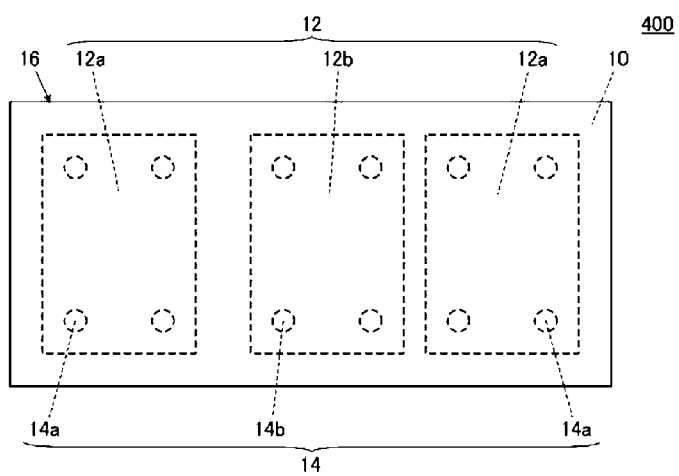
FIG. 4 is a top view illustrating a configuration of an electronic component according to a fourth preferred embodiment of the present invention.

FIG. 4 is a top view illustrating a configuration of an electronic component 400 according to a fourth preferred embodiment of the present invention. Note that in FIG. 4, the bump 14 is illustrated seeing through the sealing portion 16 and the chip component 12. As illustrated in FIG. 4, in the electronic component 400 according to the fourth preferred embodiment of the present invention, the chip components 12 are disposed at unequal intervals along the longitudinal direction of the package substrate 10. In the present preferred embodiment, an arrangement interval of the chip component 12 in the longitudinal direction of the package substrate 10 is changed from that in the first preferred embodiment, and the remaining configuration is the same as that of the first preferred embodiment.

Fifth Preferred Embodiment

Figure 5:
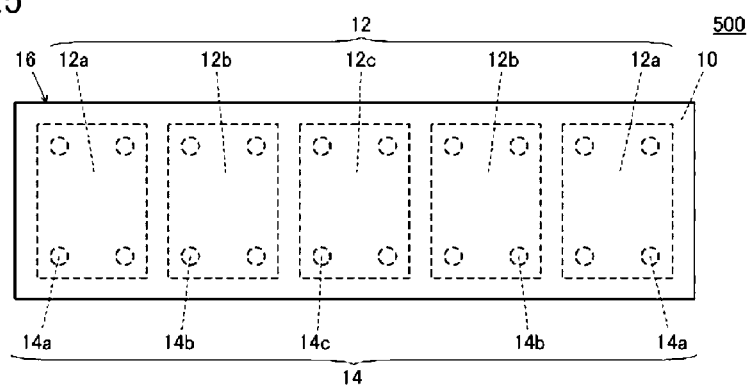
FIG. 5 is a top view illustrating a configuration of an electronic component according to a fifth preferred embodiment of the present invention.

FIG. 5 is a top view illustrating a configuration of an electronic component according to a fifth preferred embodiment of the present invention. Note that in FIG. 5, the bump 14 is illustrated seeing through the sealing portion 16 and the chip component 12. As illustrated in FIG. 5, in an electronic component 500 according to the fifth preferred embodiment of the present invention, five chip components 12 disposed in alignment at equal intervals along the longitudinal direction of the package substrate 10 are connected to an upper surface of the package substrate 10 by bumps 14.

The chip component 12a disposed at an end portion in the longitudinal direction of the package substrate 10 is connected to the package substrate 10 by the bump 14a. The chip component 12b disposed inward relative to the end portion in the longitudinal direction of the package substrate 10 is connected to the package substrate 10 by the bump 14b. A chip component 12c sandwiched between the chip components 12b and disposed inward relative to the end portion in the longitudinal direction of the package substrate 10 is connected to the package substrate 10 by a bump 14c, for example, at four corners of the chip component 12c. The bump 14c is preferably made of, for example, a lead-free solder bump.

The bump 14c is not limited to a lead-free solder bump. As the bump 14c, for example, a general solder bump or other suitable bump may be used. Further, the arrangement of the chip component 12c and the bump 14c is not limited to the case illustrated in FIG. 5. For example, two chip components 12c may be disposed between the chip components 12b inward relative to the end portion in the longitudinal direction of the package substrate 10, and each of the two chip components 12c and the package substrate 10 may be connected to each other by the bump 14c. In the present preferred embodiment, the number of chip components 12 is changed from that in the first preferred embodiment, and the remaining configuration is the same as that of the first preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a package substrate extending in a longitudinal direction; and
   a plurality of chip components disposed along the longitudinal direction of the package substrate and each connected to the package substrate by a bump; wherein
   a height of any bump connecting at least one chip component disposed at an end portion in the longitudinal direction of the package substrate among the plurality of chip components and the package substrate is greater than a height of any bump connecting at least one chip component disposed inward relative to the end portion in the longitudinal direction of the package substrate among the plurality of chip components and the package substrate; and
   in a top view of the package substrate, the plurality of chip components are spaced apart from one another along the longitudinal direction of the package substrate.

2. The electronic component according to claim 1, wherein the bump connecting the at least one chip component disposed at the end portion in the longitudinal direction of the package substrate and the package substrate is a solder bump.

3. The electronic component according to claim 2, wherein the bump connecting the at least one chip component disposed at the end portion in the longitudinal direction of the package substrate and the package substrate is a lead-free solder bump.

4. The electronic component according to claim 3, wherein the lead-free solder bump has a Young's modulus of greater than or equal to about 20 GPa and less than or equal to about 50 GPa.

5. The electronic component according to claim 2, wherein the solder bump has a Young's modulus of greater than or equal to about 15 GPa and less than or equal to about 30 GPa.

6. The electronic component according to claim 1, wherein the bump connecting the at least one chip component disposed inward relative to the end portion in the longitudinal direction of the package substrate and the package substrate is a gold bump.

7. The electronic component according to claim 6, wherein the gold bump has a Young's modulus of about 79 GPa.

8. The electronic component according to claim 1, wherein the plurality of chip components include five chip components.

9. The electronic component according to claim 1, wherein the package substrate has a rectangular or substantially rectangular shape.

10. The electronic component according to claim 1, further comprising a sealing portion disposed on an upper surface of the package substrate and sealing the plurality of chip components.

11. The electronic component according to claim 10, wherein the sealing portion is made of resin.

12. The electronic component according to claim 1, wherein at least one of the plurality of chip components is a SAW chip.

13. The electronic component according to claim 1, wherein the package substrate is an alumina substrate.

14. The electronic component according to claim 1, wherein the plurality of chip components include three chip components.

15. The electronic component according to claim 1, wherein at least one of the plurality of chip components has a different size than another one of the plurality of chip components.

16. The electronic component according to claim 1, wherein the plurality of chip components are disposed at unequal intervals along the longitudinal direction of the package substrate.

17. The electronic component according to claim 1, wherein the plurality of chip components are each connected to the package substrate by a plurality of the bumps.

18. The electronic component according to claim 17, wherein the plurality of the bumps are disposed at four corners of each of the plurality of chip components.

19. An electronic component comprising:
   a package substrate extending in a longitudinal direction; and
   a plurality of chip components disposed along the longitudinal direction of the package substrate and each connected to the package substrate by a bump; wherein
   a height of a bump connecting at least one chip component disposed at an end portion in the longitudinal direction of the package substrate among the plurality of chip components and the package substrate is greater than a height of a bump connecting at least one chip component disposed inward relative to the end portion in the longitudinal direction of the package substrate among the plurality of chip components and the package substrate; and
   the height of the bump connecting the at least one chip component disposed at the end portion in the longitudinal direction of the package substrate is greater than or equal to about 80 μm and less than or equal to about 100 μm.

20. An electronic component comprising:
a package substrate extending in a longitudinal direction; and
a plurality of chip components disposed along the longitudinal direction of the package substrate and each connected to the package substrate by a bump; wherein
a height of a bump connecting at least one chip component disposed at an end portion in the longitudinal direction of the package substrate among the plurality of chip components and the package substrate is greater than a height of a bump connecting at least one chip component disposed inward relative to the end portion in the longitudinal direction of the package substrate among the plurality of chip components and the package substrate; and
the height of the bump connecting the at least one chip component disposed inward relative to the end portion in the longitudinal direction of the package substrate is greater than or equal to about 15 μm and less than or equal to about 20 μm.

* * * * *